United States Patent [19]

Folta et al.

[11] Patent Number: 5,831,870
[45] Date of Patent: Nov. 3, 1998

[54] METHOD AND SYSTEM FOR CHARACTERIZING INTERCONNECT DATA WITHIN AN INTEGRATED CIRCUIT FOR FACILITATING PARASITIC CAPACITANCE ESTIMATION

[75] Inventors: Alan Charles Folta; Sharad Mehrotra; Parsotam Trikam Patel, all of Austin; Paul Gerard Villarrubia, Round Rock, all of Tex.

[73] Assignee: International Business Machines Corporation, Armonk, N.Y.

[21] Appl. No.: 726,722

[22] Filed: Oct. 7, 1996

[51] Int. Cl.[6] .................................................. G06F 17/50
[52] U.S. Cl. .......................................... 364/490; 364/488
[58] Field of Search ................................... 364/488, 489, 364/490, 491, 578

[56] References Cited

U.S. PATENT DOCUMENTS

| | | | |
|---|---|---|---|
| 3,755,689 | 8/1973 | Elmer et al. ............................. | 307/205 |
| 5,367,469 | 11/1994 | Hartoog .................................. | 364/491 |
| 5,379,232 | 1/1995 | Komoda ................................... | 364/489 |
| 5,452,224 | 9/1995 | Smith, Jr. et al. ...................... | 364/488 |
| 5,502,644 | 3/1996 | Hamilton et al. ........................ | 364/488 |
| 5,504,037 | 4/1996 | Iwamatsu ................................ | 437/187 |
| 5,610,833 | 3/1997 | Chang et al. ........................... | 364/491 |
| 5,629,860 | 5/1997 | Jones et al. ............................. | 364/490 |
| 5,706,206 | 1/1998 | Hammer et al. ......................... | 364/489 |

OTHER PUBLICATIONS

"Time Efficient VLSI Artwork Analysis Algorithms in Goalie2," *Chiang et al.*, 25th ACM/IEEE Design Automation Conference, 1988.

"Plane–Sweep Algorithms for Intersecting Geometric Figures," *J. Nievergelt et al.*, Communications fo the ACM, 1982.

Primary Examiner—Kevin J. Teska
Assistant Examiner—Leigh Marie Garbowski
Attorney, Agent, or Firm—Anthony V. S. England; Anthony P. Ng; Andrew J. Dillon

[57] ABSTRACT

A method and system for characterizing interconnect data within an integrated circuit in order to facilitate parasitic capacitance estimation is disclosed. An integrated circuit typically includes a substrate layer and several metal layers. In accordance with the method and system of the present invention, an overlapping area of interconnect wires is first identified within the integrated circuit. This overlapping area, which is a polygon, may be formed between the substrate layer and at least one interconnect wire in one of the several metal layers. The overlapping area may also be formed between two interconnect wires, each in a different one of the several metal layers. A netname for the overlapping area is then recorded. Finally, a netname of an interconnect wire in a metal layer that is at the same level of an interconnect wire within the overlapping area and an associated distance from each side of the overlapping area is recorded, for every interconnect wire within the overlapping area. By utilizing these recorded information, the parasitic capacitance of the integrated circuit can be estimated more efficiently.

15 Claims, 4 Drawing Sheets

METHOD AND SYSTEM FOR CHARACTERIZING INTERCONNECT DATA WITHIN AN INTEGRATED CIRCUIT FOR FACILITATING PARASITIC CAPACITANCE ESTIMATION

BACKGROUND OF THE INVENTION

1. Technical Field

The present invention relates to a method and system for data processing in general and, in particular, to a method and system for characterizing data for capacitance estimation. Still more particularly, the present invention relates to a method and system for characterizing interconnect data within an integrated circuit in order to facilitate parasitic capacitance estimation.

2. Description of the Prior Art

During the course of designing a very large-scale integrated (VLSI) circuit, it is desirable to render some form of circuit characterization in order to determine the performance of the circuit. The characteristic of a VLSI circuit is generally dependent upon two major factors, namely, parasitic capacitance and parasitic resistance. Typically, a circuit extraction software, such as a netlist extractor, is utilized to extract various circuits that are required to be simulated, from the VLSI circuit design. The result of such circuit extraction includes not only the circuitry itself, but also includes the parasitic capacitance and parasitic resistance that are inherent within the interconnect materials.

Needless to say, parasitic capacitances associated with the interconnect materials within a VLSI circuit can result in unacceptable circuit performances. Hence, it is very important to calculate all the parasitic capacitances within a VLSI circuit in order to determine whether or not they exceed certain design criteria before actual fabrication of the circuit. In practice, however, it is quite difficult to calculate all the parasitic capacitance within a VLSI circuit. The difficulties lie, in part, upon the shortcomings of computational techniques and the speed/memory limitation of the current computing technologies. In order to be practical and convenient, the computation of parasitic capacitance within a VLSI circuit having, for example, one million transistors, should preferably be performed via a desktop workstation within a reasonable period of time. Unless the speed/memory limitation of the desktop workstation can be drastically improved, otherwise, it would be quite time-consuming to perform a full-scale parasitic capacitance characterization on a VLSI circuit.

Consequently, it would be desirable to provide a method for characterizing interconnect data within a VLSI circuit such that parasitic capacitance data extraction and estimation can be performed in a more efficient manner.

SUMMARY OF THE INVENTION

In view of the foregoing, it is therefore an object of the present invention to provide an improved method and system for data processing.

It is another object of the present invention to provide an improved method and system for characterizing data for capacitance estimation.

It is yet another object of the present invention to provide an improved method and system for characterizing interconnect data within an integrated circuit in order to facilitate parasitic capacitance estimation.

An integrated circuit typically includes a substrate layer and several metal layers. In accordance with the method and system of the present invention, an overlapping area of interconnect wires is first identified within the integrated circuit. This overlapping area, which is a polygon, may be formed between the substrate layer and at least one interconnect wire in one of the several metal layers. The overlapping area may also be formed between two interconnect wires, each in a different one of the several metal layers. A netname for the overlapping area is then recorded. Finally, a netname of an interconnect wire in a metal layer that is at the same level of an interconnect wire within the overlapping area and an associated distance from each side of the overlapping area are recorded, for every interconnect wire within the overlapping area. By utilizing these recorded information, the parasitic capacitance of the integrated circuit can be estimated more efficiently.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention may be executed in a variety of computers under a number of different operating systems. The computer may be, for example, a workstation, a mini-computer, or a mainframe computer. In addition, the computer may be a stand-alone system or part of a network such as a local-area network (LAN) or a wide-area network (WAN).

Figure 1:
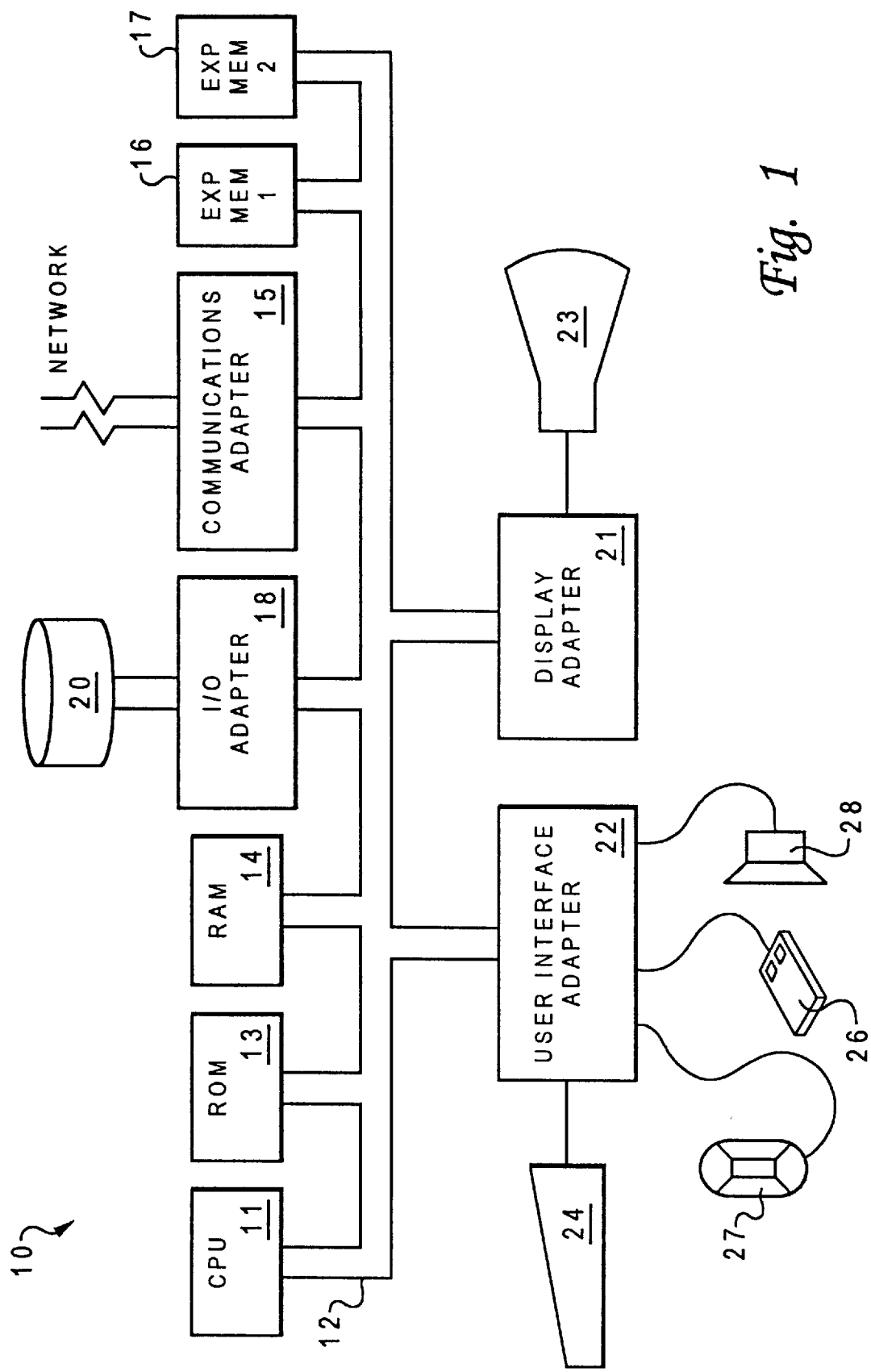
FIG. 1 is a diagram of a typical workstation that may be utilized in conjunction with a preferred embodiment of the present invention.

Referring now to the drawings and in particular to FIG. 1, there is depicted a diagram of a typical workstation 10 that may be utilized in conjunction with a preferred embodiment of the present invention. A central processing unit (CPU) 11 is interconnected to various other components via system bus 12. Read only memory (ROM) 13, connecting to CPU 11 via system bus 12, includes a basic input/output system (BIOS) software that controls certain basic functions of workstation 10. Random access memory (RAM) 14, I/O adapter 18 and communications adapter 15 are also interconnected to system bus 12. Expanded memory 16 and expanded memory 17 may be added to workstation 10, and are shown to be interconnected to system bus 12.

Generally, expanded memories 16 and 17 are adapter cards that include multiple single in-line memory modules (SIMMs) along with corresponding registers capable of being written to by an appropriate device driver. I/O adapter 18 may be a Small Computer System Interface (SCSI) adapter that communicates with a disk storage device 20.

Communications adapter 15 interconnects system bus 12 with an outside network, enabling workstation 10 to communicate with other such systems. In addition, input/output devices are connected to system bus 12 via user interface adapter 22 and display adapter 21. Keyboard 24, track ball 27, mouse 26, and speaker 28 are all interconnected to system bus 12 via user interface adapter 22. Display monitor 23 is connected to system bus 12 via display adapter 21. In this manner, a user is capable of inputting to workstation 10 through keyboard 24, track ball 27, or mouse 26 while receiving output from workstation 10 via speaker 28 and display monitor 23. Additionally, an operating system such as AIX™ from International Business Machine Corporation may be utilized to coordinate the functions of the various components shown in FIG. 1.

Preferred implementations of the invention include implementations as a computer system programmed to execute the method or methods described herein, and as a computer program product. According to the computer system implementation, sets of instructions for executing the method or methods are resident in the random access memory 14 of one or more computer systems configured generally as described above. Until required by the computer system, the set of instructions may be stored as a computer program product in another computer memory, for example, in disk drive 20 (which may include a removable memory such as an optical disk or floppy disk for eventual use in the disk drive 20). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Note that the invention describes terms such as comparing, validating, selecting or other terms that could be associated with a human operator. However, for at least a number of the operations described herein which form part of the present invention, no action by a human operator is desirable. The operations described are, for at least the most part, machine operations processing electrical signals to generate other electrical signals.

Figure 2:
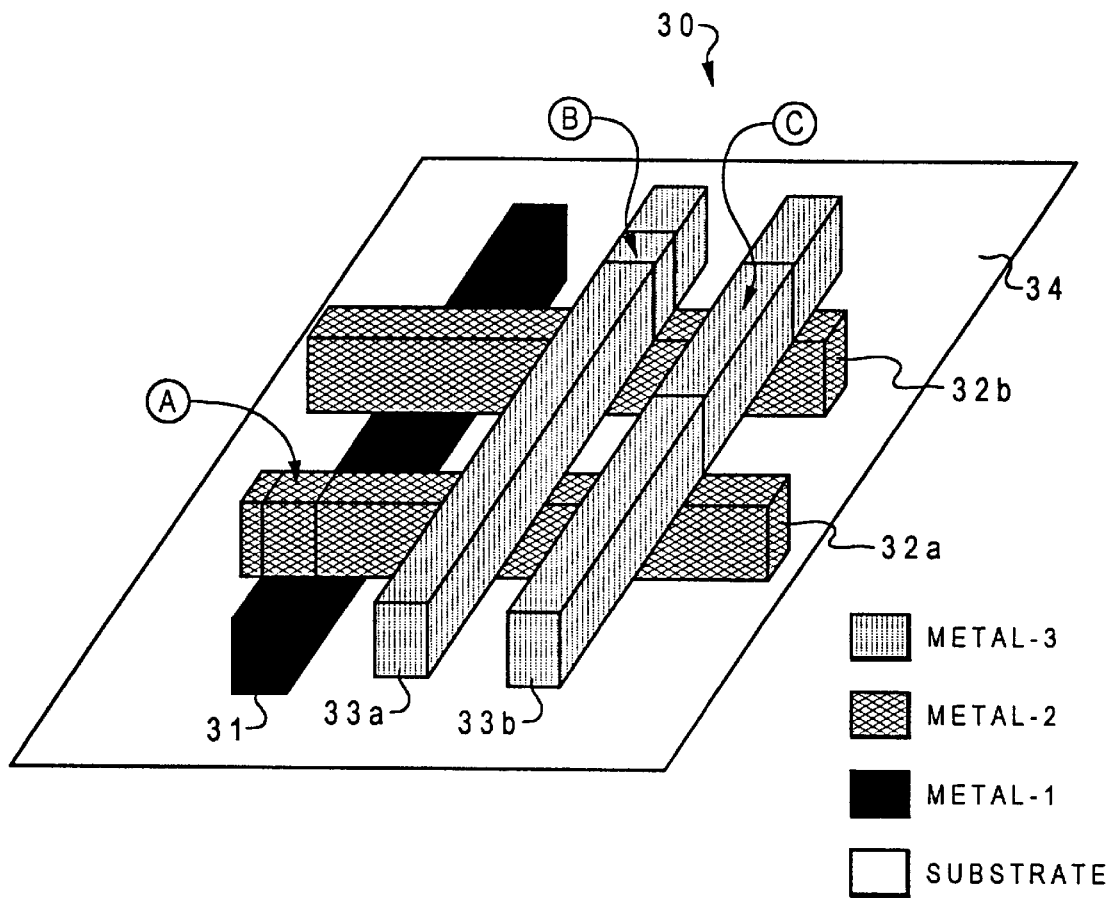
FIG. 2 is a pictorial illustration of a multi-layer metal interconnect geometry.

With reference now to FIG. 2, there is a pictorial illustration of a multi-layer metal interconnect geometry. Interconnect geometry 30, as shown, is comprised of a metal-1 layer, a metal-2 layer, a metal-3 layer, and a substrate layer, though more or fewer metal layers may be present in a typical integrated circuit. Various interconnects in each metal layer depicted in FIG. 2 is represented by a metal-1 wire 31; metal-2 wires 32a, 32b; and metal-3 wires 33a, 33b on top of a substrate 34. In addition, there is a dielectric layer (not shown) embedded between each of the above-mentioned layers.

In accordance with a preferred embodiment of the present invention, each of wires 31–33 may be conceptually broken down into several overlapping regions, depending on the interconnect layer present directly above and below the wire segment. If crossover capacitance was the only effect to be considered, then each overlapping region can be processed separately to obtain the total capacitance. In order to properly account for fringing and line-to-line effects, however, the knowledge of an interconnect wire's nearest neighbors on each metal layer is also required. Given the proximity of a ground plane on substrate 34, it is only necessary to look for a neighbor within a distance of several inter-layer dielectric (ILD) thicknesses away from the overlapping region perpendicular to the edges of the overlapping region. If no edge is found within this distance, then the neighborhood is considered empty.

Some examples of overlapping regions for interconnect geometry 30 are shown in FIG. 2. Overlapping region A includes a metal-2 layer, a metal-1 layer, and a substrate layer. Overlapping region B includes a metal-3 layer, a metal-2 layer, and a substrate layer. Overlapping region C includes a metal-3 layer, and a substrate layer.

The information about the metal layers present within an overlapping region and the edge parallel to the sides of the overlapping region constitutes a "capacitance event." Thus, a capacitance event is designated by the layers present in a unique polygon overlapping region, in which every layer is either fully present or not present at all, and a unique neighborhood is perpendicular to each side of the overlapping region. Most often, the overlapping region is rectangular in shape.

After an overlapping region has been defined, information about wire conductor edges, or "true edges," present on the sides of the overlapping region, can be specified accordingly. A "neighborhood" in a given direction, is described by the distance and the netname of the nearest wire conductor edge on each metal layer present within an overlapping region. If the nearest edge on a certain metal layer is more than a prescribed distance away, then the neighborhood is considered empty on that metal layer. For example, in FIG. 2, if metal-2 wire 32a is located at a position more than a prescribed distance away from metal-2 wire 32b within overlapping region B, then the neighborhood in that direction for metal-2 layer in overlapping region B is considered as empty.

For large VLSI circuit layouts, the shapes of wire conductors within various metal layers are primarily rectilinear and run in two orthogonal directions. These two orthogonal directions may be arbitrarily defined as north/south and east/west or front/back and left/right. By relying upon the assumption that each wire conductor within various metal layers is rectilinear and run in one of the two orthogonal directions, the entire VLSI circuit layout can be uniquely and completely partitioned into several disjoint capacitance events.

Figure 3:
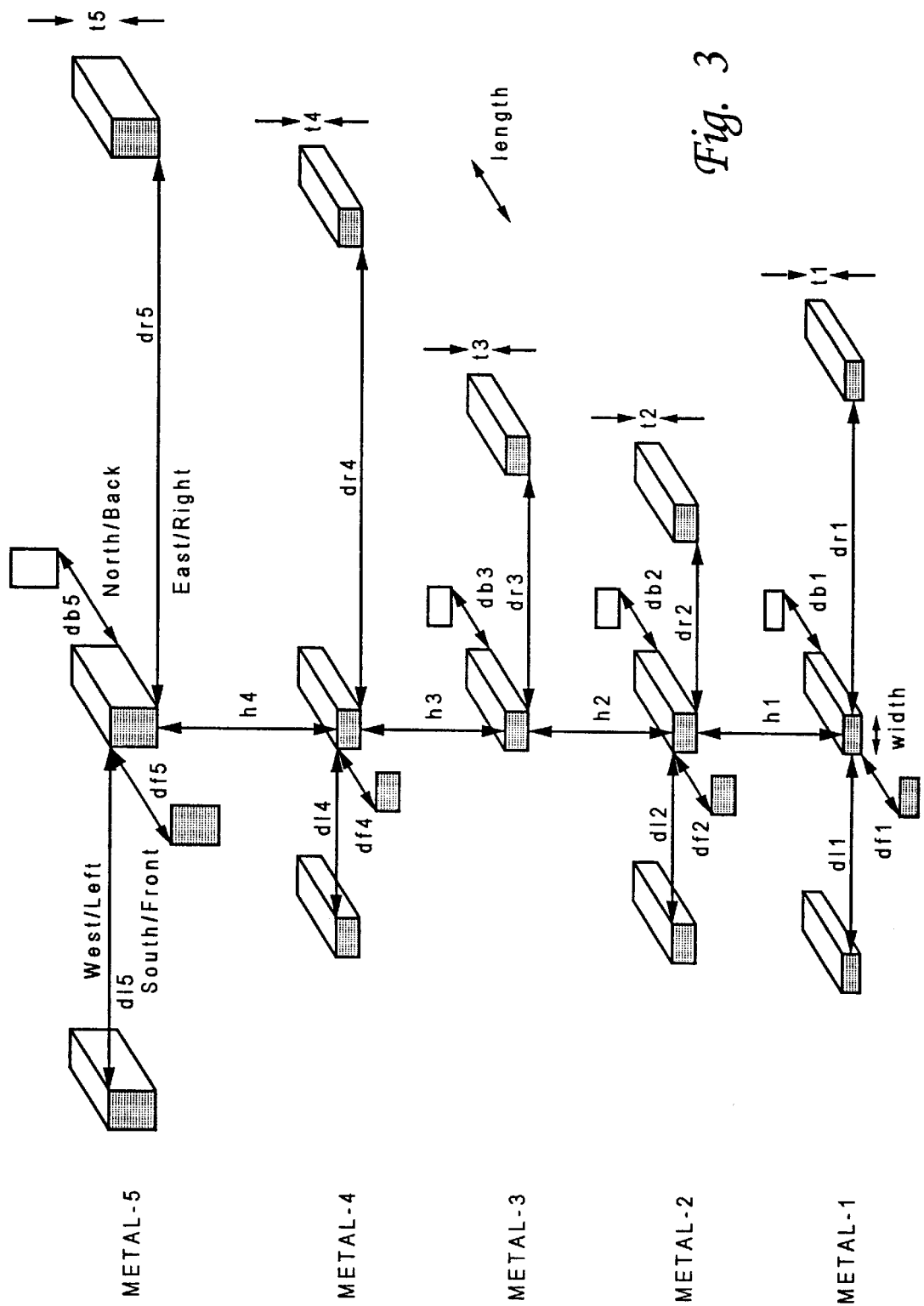
FIG. 3 is a pictorial illustration of a capacitance event in a five-layer metal interconnect layout.

Referring now to FIG. 3, there is depicted a pictorial illustration of a capacitance event in a five-layer metal interconnect layout. The neighbors present in metal-1 layer are dl1, dr1, df1, and db1. Similarly, the neighbors present in metal-2 layer are dl2, dr2, df2, and db2. There are only two neighbors existing in metal-3 layer and three neighbors existing in metal-4 layer. In metal-3 layer, the neighbors present are dr3 and db3, while in metal-4 layer, the neighbors present are dl4, dr4, and df4. Finally, the neighbors present in metal-5 layer are dl5, dr5, df5, and db5. Note that the distances not shown in metal-3 layer and metal-4 layer, such as dl3, df3 in metal-3 layer and db4 in metal-4 layer, indicate empty neighborhoods. This may be attributed to the fact that no wire conductor edge is found in that layer or that the nearest adjacent wire in that layer is more than a prescribed distance away.

Dielectric heights h1 through h4 and wire thicknesses t1 through t5 are only a function of the processing technology. Accordingly, dielectric heights and wire thicknesses are usually constant over all capacitance events in a given design. Hence, dielectric heights h1–h4 and wire thicknesses t1–t5 are not recorded in each capacitance event separately for the characterization of interconnect data, under the present invention.

Figure 4:
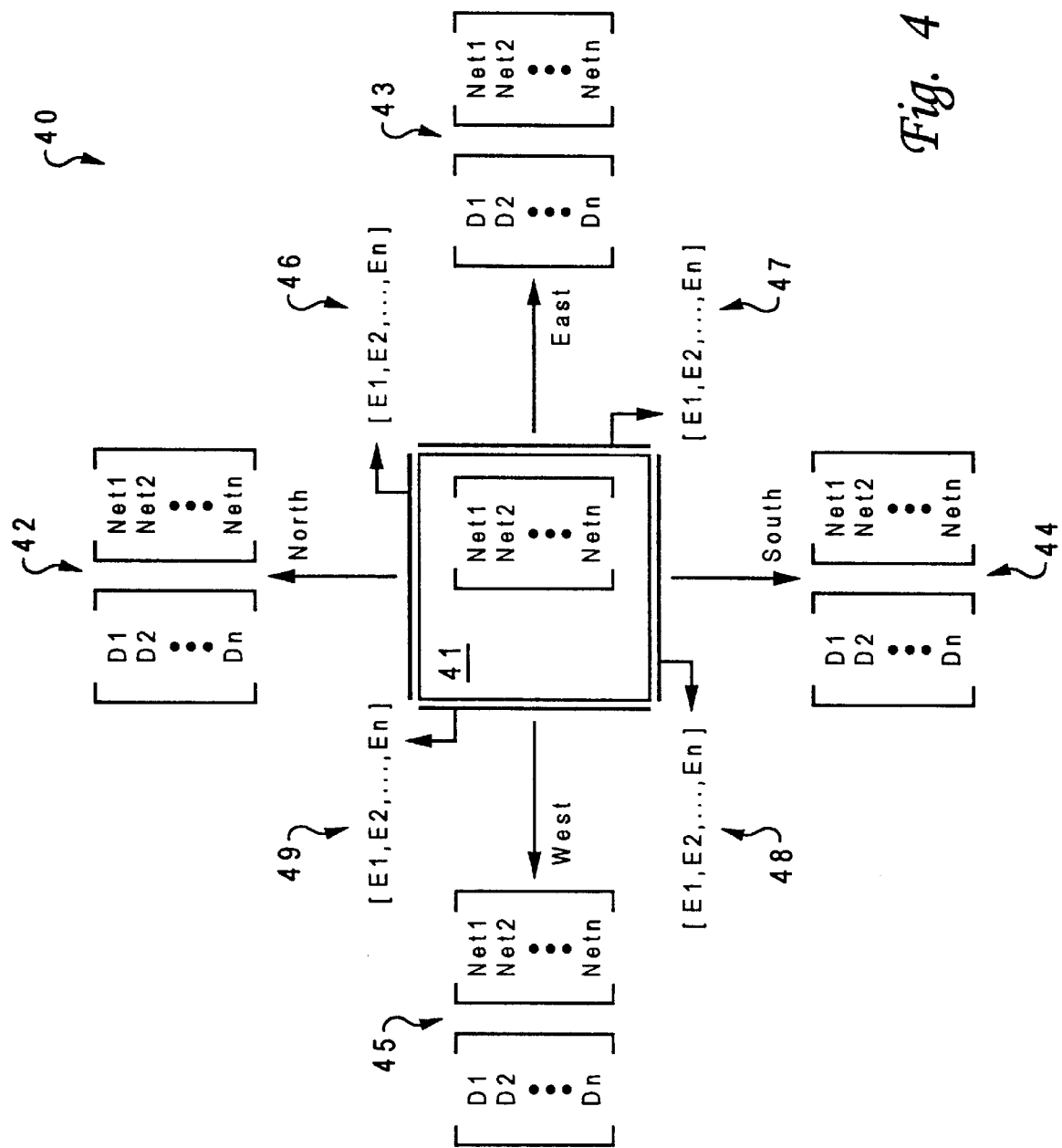
FIG. 4 is a block diagram of a data structure for characterizing a capacitance event in a multi-layer metal interconnect geometry, in accordance with a preferred embodiment of the present invention.

With reference now to FIG. 4, there is shown a data structure for characterizing a capacitance event in a multi-layer metal interconnect geometry, in accordance with a preferred embodiment of the present invention. As shown, data structure 40 comprises a center array 41 and four neighborhood arrays 42–45. Center array 41 describes various wire conductors present within a specific overlapping region (or overlapping area) in the form of netnames ([Net1, Net2, . . . , Netn]). A netname is a name of a logical connection in a design netlist. Each of four neighborhood arrays 42–45 defines whether or not there are true wire conductor edges present in each of the sides of the specific overlapping region, in the form of distance from the specific overlapping region along with the associated netnames ([D1, D2, . . . , Dn] [Net1, Net2, . . . , Netn]). Center array 41 and neighborhood arrays 42–45 may be stored in a database within the workstation shown in FIG. 1.

In addition to neighborhood arrays 42–45, edge arrays 46–49 may be inserted to the database within the workstation for indicating the presence of true wire conductor edges. A logical "1" in an element within edge arrays 46–49 ([E1, E2, . . . , En]) can be utilized to indicate the presence of a true wire conductor edge while a logical "0" indicates the opposite. Because the information contained within edge arrays 46–48 can be implied from the distance information ([D1, D2, . . . , Dn]) contained within neighborhood arrays 42–45, the presence of edge arrays 46–49 in data structure 40 is optional.

A capacitance event captures all the geometric information necessary to compute the dominant overlap, fringing, and line-to-line capacitances of the wire segments present in an overlapping region. Hence, by processing each capacitance event separately, the capacitance for each shape in the circuit layout can be deduced. For example, the crossover capacitance, which includes the overlap-area capacitance and the edge-fringing capacitances, can be determined in the capacitance event describing the overlapping region. The capacitance shielding between a wire in metal-1 layer and a wire in metal-3 layer by a orthogonal metal-2 wires can be properly determined in the metal-1 to metal-3 overlapping region, because the metal-2 neighbor distances on the east-west side are known even though metal-2 is not present in the overlapping region.

By changing the information in neighborhood arrays 42–45, the accuracy of the parasitic capacitance model can be changed. Additional detail may be inserted to the parasitic capacitance model by changing the labels in neighborhood arrays 42–45. For example, if only total capacitance of each wire conductor is desired, neighborhood arrays 42–45 will have only distances specified in them. If a decoupled RC network is desired, then neighborhood arrays 42–45 should include all netnames within. If a fully coupled RC model is desired, then neighborhood arrays 42–45 should have a nodename (of a resistance network) within. Hence, data structure 40 of FIG. 4 is amenable to extracting parasitic capacitance information in accordance with a varying degree of detail as one desires. Because evaluation of each capacitance event may be performed separately (actually, in parallel), the shapes processing (to partition the integrated circuit layout into disjointed capacitance events) becomes the speed-determining factor in the layout extraction process, regardless of the desired accuracy of capacitance computation. This is an enormous advantage over any technique under prior art because very efficient shapes processing can be performed to compute the overlapping and neighborhood information in circuit layouts with rectangular, orthogonal wire conductors. Thus, partitioning a VLSI circuit layout into multiple disjointed capacitance events, in accordance with a preferred embodiment of the present invention, allows dramatic speed improvement in circuit layout extraction process, while achieving high accuracy in modeling three-dimensional effects in the parasitic capacitance computation.

As has been described, the present invention provides an improved method of characterizing interconnect data within an integrated circuit for facilitating parasitic capacitance estimation. Based upon the assumption that each wire within various metal layers is rectilinear and runs in one of the two orthogonal directions, the entire integrated circuit layout can be uniquely and completely partitioned into multiple disjointed capacitance events. These capacitance events are recorded under a novel data structure such that high-accuracy parasitic capacitance computation can be performed in an efficient manner.

While the invention has been particularly shown and described with reference to a preferred embodiment, it will be understood by those skilled in the art that various changes in form and detail may be made therein without departing from the spirit and scope of the invention.

What is claimed is:

1. A method of characterizing interconnect data within an integrated circuit for facilitating parasitic capacitance estimation, wherein said integrated circuit includes a substrate layer and a plurality of metal layers, said method comprising the steps of:

identifying an overlapping area within said integrated circuit, wherein said overlapping area is formed between said substrate layer and at least one interconnect wire in one of said plurality of metal layers or between at least two interconnect wires, each in a different one of said plurality of metal layers, wherein said overlapping area is a polygon;

recording a netname for said overlapping area; and for each of said plurality of metal layers, recording a netname of an interconnect wire and an associated distance of said interconnect wire from each side of said overlapping area, wherein parasitic capacitance of said integrated circuit can be efficiently estimated by utilizing said recorded information.

2. The method of characterizing interconnect data within an integrated circuit for facilitating parasitic capacitance estimation according to claim 1, wherein said step of recording a netname of an interconnect wire is performed on all sides of said overlapping area.

3. The method of characterizing interconnect data within an integrated circuit for facilitating parasitic capacitance estimation according to claim 1, wherein said step of recording a netname for said overlapping area further includes a step of recording a netname for said overlapping area in an array.

4. The method of characterizing interconnect data within an integrated circuit for facilitating parasitic capacitance estimation according to claim 1, wherein said step of recording a netname of an interconnect wire further includes a step of recording a distance and an associated netname in corresponding arrays.

5. The method of characterizing interconnect data within an integrated circuit for facilitating parasitic capacitance estimation according to claim 1, wherein said method further includes a step of recording an edge array on each side of said overlapping area.

6. A computer system for characterizing interconnect data within an integrated circuit for facilitating parasitic capacitance estimation, wherein said integrated circuit includes a substrate layer and a plurality of metal layers, said computer system comprising:

means for identifying an overlapping area within said integrated circuit, wherein said overlapping area is formed between said substrate layer and at least one interconnect wire in one of said plurality of metal layers or between at least two interconnect wires, each in a different one of said plurality of metal layers, wherein said overlapping area is a polygon;

means for recording a netname for said overlapping area; and means for recording a distance and an associated netname from each side of said overlapping area to an interconnect wire for each of said plurality of metal layers, wherein parasitic capacitance of said integrated circuit can be efficiently estimated by utilizing said recorded information.

7. The computer system for characterizing interconnect data within an integrated circuit for facilitating parasitic capacitance estimation according to claim 6, wherein said overlapping area is a rectangle.

8. The computer system for characterizing interconnect data within an integrated circuit for facilitating parasitic capacitance estimation according to claim 6, wherein said means for recording a netname for said overlapping area further includes means for recording a netname for said overlapping area in an array.

9. The computer system for characterizing interconnect data within an integrated circuit for facilitating parasitic capacitance estimation according to claim 6, wherein said means for recording a distance and an associated netname further includes means for recording a distance and an associated netname in corresponding arrays.

10. The computer system for characterizing interconnect data within an integrated circuit for facilitating parasitic capacitance estimation according to claim 6, wherein computer system further includes means for recording an edge array on each side of said overlapping area.

11. A computer program product for characterizing interconnect data within an integrated circuit for facilitating parasitic capacitance estimation, wherein said integrated circuit includes a substrate layer and a plurality of metal layers, said computer program product comprising:

program code means for identifying an overlapping area within said integrated circuit, wherein said overlapping area is formed between said substrate layer and at least one interconnect wire in one of said plurality of metal layers or between at least two interconnect wires, each in a different one of said plurality of metal layers, wherein said overlapping area is a polygon;

program code means for recording a netname for said overlapping area; and program code means for recording a distance and an associated netname from each side of said overlapping area to an interconnect wire in a metal layer that is at the same level of an interconnect wire for each of said plurality of metal layers, wherein parasitic capacitance of said integrated circuit can be efficiently estimated by utilizing said recorded information.

12. The computer program product for characterizing interconnect data within an integrated circuit for facilitating parasitic capacitance estimation according to claim 11, wherein said overlapping area is a rectangle.

13. The computer program product for characterizing interconnect data within an integrated circuit for facilitating parasitic capacitance estimation according to claim 11, wherein said program code means for recording a netname for said overlapping area further includes program code means for recording a netname for said overlapping area in an array.

14. The computer program product for characterizing interconnect data within an integrated circuit for facilitating parasitic capacitance estimation according to claim 11, wherein said program code means for recording a distance and an associated netname further includes program code means for recording a distance and an associated netname in corresponding arrays.

15. The computer program product for characterizing interconnect data within an integrated circuit for facilitating parasitic capacitance estimation according to claim 11, wherein computer program product further includes program code means for recording an edge array on each side of said overlapping area.

* * * * *